United States Patent [19]

Carter

[11] 4,348,658
[45] Sep. 7, 1982

[54] ANALOG-TO-DIGITAL CONVERTER USING HALF RANGE TECHNIQUE

[75] Inventor: Ernest A. Carter, Austin, Tex.
[73] Assignee: Motorola, Inc., Schaumburg, Ill.
[21] Appl. No.: 148,097
[22] Filed: May 9, 1980
[51] Int. Cl.³ .......................................... H03K 13/08
[52] U.S. Cl. ....................... 340/347 AD; 340/347 M; 340/347 CC; 340/347 SH
[58] Field of Search .... 340/347 AD, 347 M, 347 CC, 340/347 SH

[56] References Cited

U.S. PATENT DOCUMENTS

| | | | |
|---|---|---|---|
| 3,056,085 | 9/1962 | James et al. | 340/347 AD X |
| 3,653,030 | 3/1972 | Carbrey | 340/347 AD |
| 4,028,694 | 6/1977 | Cook et al. | 340/347 AD |
| 4,129,863 | 12/1978 | Gray et al. | 340/347 AD |
| 4,195,282 | 3/1980 | Cameron | 340/347 AD |
| 4,200,863 | 4/1980 | Hodges et al. | 340/347 AD |

OTHER PUBLICATIONS

Timbie et al., PRINCIPLES OF ELECTRICAL ENGINEERING, John Wiley & Sons, Inc., 1922, pp. 309–311.

Primary Examiner—T. J. Sloyan
Attorney, Agent, or Firm—Anthony J. Sarli, Jr.; Jeffrey Van Myers; Vincent Ingrassia

[57] ABSTRACT

In a successive-approximation charge-redistribution analog-to-digital converter which includes a binary weighted capacitive ladder network, an unknown analog input voltage is sampled only on the largest capacitor representing half the capacitance. The conversion phase proceeds utilizing all the capacitance and only half the reference voltage. This not only reduces circuit complexity, but also reduces problems associated with disruption of the charge stored on the capacitor.

7 Claims, 1 Drawing Figure

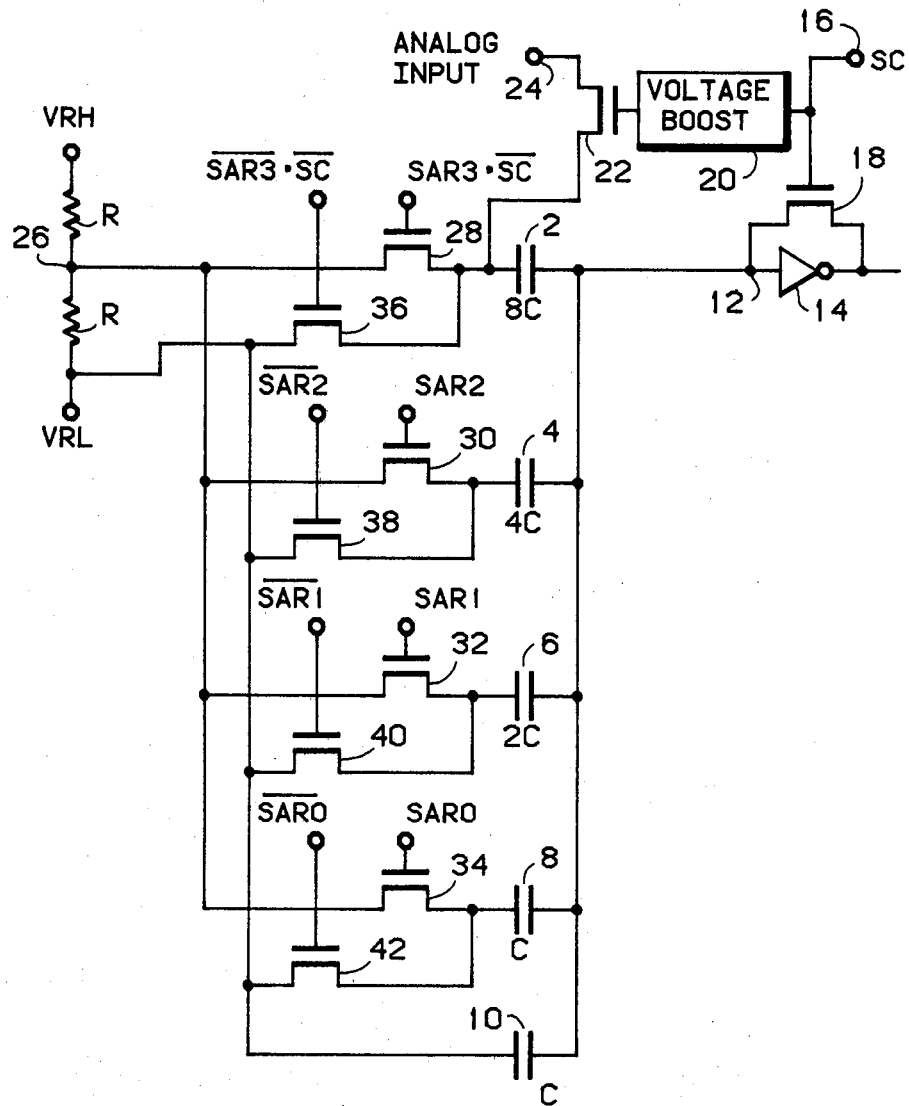

ANALOG-TO-DIGITAL CONVERTER USING HALF RANGE TECHNIQUE

BACKGROUND OF THE INVENTION

Field of the Invention

This invention relates generally to analog-to-digital (A/D) converters and, more particularly, to a metal-oxide-semiconductor (MOS) charge-redistribution, successive-approximation analog-to-digital converter which is simple, occupies little silicon area and which reduces errors due to comparator input leakage problems.

The advantages offered by NMOS technology are well known; e.g. higher density, greater yield, etc. Thus, smaller NMOS device geometries permit a greater number of devices to be produced per unit area or, stated another way, a single NMOS device will occupy less space. This characteristic is extremely important in the design and fabrication of complex digital integrated circuits; for example, single chip microprocessors.

Whereas digital circuitry is generally characterized by its "on/off" or "one/zero" nature, most measurements in the real world are inherently analog; e.g. temperature, pressure, speed, voltage, etc. Therefore, it is necessary that microprocessors and other digital circuitry communicate or interface with analog circuitry such as amplifiers, buffers, comparators, etc., in order to permit digital processing of analog signals. In each case, it is also necessary to convert the analog signals to digital voltage levels.

The required interfacing between digital and analog circuitry may be accomplished by providing analog components which are external to the microprocessor chip. However, such arrangements generally are more expensive, require more current, a larger power supply and commonly present more opportunities for design and manufacturing errors. To avoid these disadvantages, complex analog circuits such as A/D converters are being manufactured integrally with the digital circuitry; eg. on the microprocessor chip itself, and due to the complex nature of microprocessors, the inclusion of analog devices on the same chip requires that the same manufacturing process be employed. Thus, an A/D converter included on an NMOS microprocessor chip must be fabricated in accordance with NMOS processing techniques, and the design of the analog circuits such as A/D converter circuits must be tailored to such processing techniques.

Successive approximation analog-to-digital conversion is well known. For example, see U.S. Pat. Nos. 3,964,061; 3,949,395; 3,603,970; and 3,581,304. It involves the repeated division of the voltage range in half. In a three bit system, for example, the system will first try 100 (half scale). Next, the system will try 010 (quarter scale) or 110 (three-quarter scale) depending on whether the first approximation was too large or too small. After three approximations, a three bit representation of the unknown analog voltage is resolved. A discussion of successive-approximation A/D converters may be found in *Integrated Electronics: Analog and Digital Circuits and Systems,* McGraw-Hill, Inc., 1972, page 667.

It is also known to use a sample-and-hold circuit in conjunction with an A/D converter. A capacitor (or capacitors) is charged with the unknown analog input voltage during a sample phase, and retains the value during the conversion phase. The holding time is the length of time the circuit can hold a charge without dropping more than a specified percentage of its initial value. For an additional discussion of such circuits, see *The Logic Handbook,* Digital Equipment Corporation, 1967 Edition, page 281.

Charge redistribution approaches to A/D conversion are known e.g. U.S. Pat. No. 4,065,766. Further, the use of binary weighted capacitors is known; e.g. U.S. Pat. No. 3,836,906. In one known A/D conversion arrangement, a plurality of binary weighted capacitors are each charged by an unknown analog input signal. The common output of each of the capacitors is coupled to the input of a chopper stabilized comparator (a plurality of inverters each separated by a capacitor) which, during the sample phase, is caused to assume an input voltage which is right at its threshold voltage; i.e., a small variation at its input will cause the comparator to switch. After the sample phase, the input to the comparator is left floating; i.e. no d.c. paths. Thereafter, signals from a successive approximation register are used to control a plurality of field-effect-transistor (FET) couplers to couple each of the binary weighted capacitors to either the high reference voltage (VRH) typically 5 volts in an NMOS system or to a low reference voltage (VRL) typically ground. The analog input voltage, which may also be as high as VRH, requires field-effect-transistor coupling to each of the capacitors. It should be appreciated, that to pass either the analog input voltage or the high reference voltage through the various coupling field-effect-transistor coupling switches, it is necessary that the enabling voltage placed on the gate electrodes of the field-effect-transistor couplers be higher than the sum of the voltage being passed plus the FET threshold voltage. In a system in which the analog input voltage may be as high as the circuit supply voltage (typically 5 volts), a voltage boost circuit would be required in each case to achieve the required gate electrode voltages.

A second problem associated with the known circuit resides in the fact that a field-effect-transistor coupler has its current conducting path connected across the input and output of the comparator. When the high reference voltage is 5 volts and the low reference voltage is zero volts, and assuming an unknown analog input signal of 5 volts, the balanced comparator input node voltage (the comparator threshold voltage) is typically 2 volts or less. Sampling is done on all binary weighted capacitors, and the first approximation connects all but the largest capacitor to ground. That is, the first approximation is 2.5 volts. Assuming negligible attenuation through the capacitors, the resulting redistribution of charge causes the comparator input voltage to drop by 2.5 volts (the analog input voltage minus the first approximation voltage), resulting in a net voltage at the input of the comparator of −0.5 volts. This, however, tends to turn on the field-effect-transistor coupler across the first stage of the comparator causing leakage to occur at the comparator input node. Since the charge stored on this node is in essence the stored sample, accuracy is lost. One known technique for avoiding this effect is to deliberately increase the parasitic capacitance at the comparator input. This, however, greatly reduces the sensitivity of the comparator and also requires more silicon area.

SUMMARY OF THE INVENTION

It is an object of the present invention to provide an improved MOS A/D converter.

It is a further object of the present invention to provide an improved N-Channel successive approximation A/D converter which substantially eliminates the need for all voltage boost circuits except for those associated with the analog input resulting in a simpler circuit which occupies less silicon area.

Finally, it is an object of the present invention to provide an improved N-Channel successive-approximation A/D converter having improved sample and hold characteristics.

According to one aspect of the invention there is provided a successive-approximation charge redistribution analog-to-digital converter of a type wherein charge is redistributed among a plurality of binary weighted capacitors each having a common first terminal and wherein successive approximations of an unknown analog inout voltage are predetermined portions of a reference voltage which are compared with said analog input voltage in a comparator, comprising: first means for sampling said unknown analog input voltage on the largest of said plurality of binary weighted capacitors; and second means for converting said unknown analog input voltage to a digital representation thereof utilizing substantially one-half said reference voltage.

BRIEF DESCRIPTION OF THE DRAWING

The above and other objects, features and advantages of the present invention will be more clearly understood from the following detailed description taken in conjunction with the accompanying drawing which is a schematic diagram of one embodiment of the invention.

DESCRIPTION OF THE PREFERRED EMBODIMENT

The arrangement shown in the sole FIGURE includes a plurality of capacitors 2, 4, 6, 8 and 10. Capacitors 2, 4, 6 and 8 are binary weighted; i.e. if capacitor 8 is considered to have unity capacitance, capacitor 6 has twice unity capacitance, capacitor 4 has four times unity capacitance and the largest capacitor 2 has eight times unity capacitance. The fifth capacitor 10 also has unity capacitance. Thus, capacitor 2 represents the same amount of capacitance as capacitors 4, 6, 8 and 10 combined.

Each of capacitors 2, 4, 6, 8 and 10 is coupled at a first terminal thereof to node 12 which is the input to an inverter 14 which is the first stage of a comparator. It should be understood that while additional comparator stages may be employed, only one stage is shown for clarity. Additionally, more binary weighted capacitors could be employed to obtain higher resolution. A sample control signal (SC) is applied via terminal 16 to the gate electrode of a first field-effect-transistor 18 having its source-drain path coupled across the input and output of inverter 14 as is shown. The sample control signal is also applied to a voltage boost circuit 20 the output of which is coupled to the gate electrode of a second field-effect-transistor 22 which when turned "on" couples an unknown analog input signal at terminal 24 to another terminal of capacitor 2. Since the analog input signal may be as high as 5 volts, it is necessary that the gate electrode voltage of field-effect-transistor 22 be capable of more than 5 volts. While many voltage boost circuits are known and suitable for this purpose, a detailed description of one such circuit may be found in copending U.S. Patent Application, Ser. No. 148,096, filed of even date herewith and assigned to the assignee of the present invention.

A voltage divider comprising first and second resistors R coupled between VRH and VRL has its half voltage node 26 coupled to capacitors 2, 4, 6 and 8 via field-effect-transistors 28, 30, 32 and 34 respectively. The low reference (VRL) is coupled to capacitors 2, 4, 6 and 8 via field-effect-transistors 36, 38, 40 and 42 respectively. As can be seen, the low reference voltage is coupled directly to capacitor 10.

During the sample phase, sample control signal SC at terminal 16 goes high turning on field-effect-transistor 18. With transistor 18 on, the input of inverter 14 is forced to its threshold voltage. The sample control signal is also applied to voltage boost circuit 20 which couples a voltage higher than 5 volts (typically 8 to 9 volts) to the gate electrode of field-effect-transistor 22 turning it on hard enough so as to pass an unknown analog input signal appearing at terminal 24 which may be as high as 5 volts. In this manner, the analog input signal is applied to capacitor 2 (node 23) which represents half of the total capacitance. It should be noted that at this point, since the sample control signal is high, a low voltage is applied to the gates of field-effect-transistors 28 and 36 maintaining them in an "off" condition. Further, signals SAR0 to SAR3, which represent the bits of a successive approximation register (not considered a part of this invention) and which control the successive approximation and redistribution process by sequentially coupling capacitors 2, 4, 6 and 8 to node 26, are all zero. Field-effect-transistors 38, 40 and 42 are turned on since $\overline{SAR2}$ $\overline{SAR1}$ and $\overline{SAR0}$ are sitting at a high voltage level and couple capacitors 4, 6 and 8 to the low reference voltage. As stated previously, capacitor 10 is directly coupled to the low reference voltage.

It should be noted that if the unknown analog input signal were to be coupled to each of the capacitors, as is the case with known arrangements, additional voltage boost circuits would be required (one for each capacitor to which the input voltage is to be coupled.) Furthermore, it should also be noted that half the high reference voltage is coupled to the capacitors via devices 28, 30, 32 and 34. If the entire high reference voltage were to be applied to the capacitors as is the case in known arrangements, additional voltage boost circuits would be required to provide the necessary voltage on the gate electrodes of devices 28, 30, 32 and 34.

The analog input is only sampled on the largest capacitor 2 (8C) which is half the total capacitance while the other capacitors are coupled to ground and the comparator is being balanced.

After the sample phase is complete, the conversion phase utilizes the well known charge distribution approach to performing a successive approximation conversion; however, this is accomplished only over one half the normal range, i.e. VRH/2 to VRL (for example 2.5 volts to ground). However, since the total comparator input capacitance used in the sample phase is half that used in the conversion phase, the stored sample as seen by the comparator is effectively halved.

A second advantage of the inventive circuit can be realized by considering the voltage at the comparator input. Assume that the high reference voltage is 5 volts, the low reference voltage is zero volts and that the analog input signal is 5 volts, and that the balanced comparator input node voltage is typically 1.3 to 2 volts. If the prior art approach were practiced, all of the capacitors 2, 4, 6, 8 and 10 would receive the unknown analog input signal during the sampling phase. The first approximation (half scale) would couple all but the largest capacitor to the low reference voltage; i.e. the first approximation would be 2.5 volts. Assuming negligible attenuation, the comparator input voltage would then drop by 2.5 volts (the analog input voltage minus the first approximation voltage) resulting in a voltage of −0.5 volts at the comparator input node 12. This negative voltage would tend to turn device 18 on disrupting the stored sample. Using the inventive approach, the sample is halved (to 2.5 volts) and the first approximation of half scale is relative to VRH/2; hence only 1.25 volts. Thus, the voltage change is only 2.5-1.25=1.25 volts. THis voltage change applied to the comparator input node results in a comparator input voltage greater than zero, thus avoiding leakage problems.

The above description is given by way of example only. For example, while a 4-bit converter is shown, additional bits may be added. Other changes in form and details may be made by one skilled in the art without departing from the scope of the invention as defined by the appended claims.

I claim:

1. A successive-approximation charge-redistribution analog-to-digital converter comprising:

comparator means for producing an output in response to an input thereto exceeding a predetermined threshold voltage;

a plurality of binary weighted capacitors, each having a first terminal coupled in common to the input of the comparator means, and a second terminal;

voltage reference means for producing first and second predetermined reference voltages;

sample means for sampling, during a sample phase, an unknown analog input voltage onto the largest of the capacitors, and for simultaneously coupling the second terminals of each of the other capacitors to the first reference voltage while shorting the comparator means; and successive approximation means for successively coupling, during a conversion phase, the second terminals of the capacitors, from the largest to the smallest, to the second reference voltage, and, in response to each such coupling which produces said output from the comparator means, recoupling such second terminal to the first reference voltage.

2. An analog-to-digital converter according to claim 1 wherein said plurality of binary weighted capacitors is included in a capacitive ladder network having a total capacitance substantially equal to twice the capacitance of the largest of said plurality of binary weighted capacitors.

3. An analog-to-digital converter according to claim 2 wherein the sampling means comprises:

a first field-effect-transistor having its current conducting path coupled between said analog input voltage and a second terminal of said largest of said capacitors and having its gate electrode coupled to a sample control signal; and first switching means for coupling the second terminal of each of the remaining capacitors to the first reference voltage.

4. An analog-to-digital converter according by claim 3 further including a voltage boost circuit coupled between said sample control signal and the gate electrode of said first field-effect-transistor.

5. An analog-to-digital converter according to claim 4 wherein said first switching means includes a first plurality of field-effect-transistors, each having its current conducting path coupled between the first reference voltage and one of the second terminals and having its gate electrode coupled to a source of a control signal for turning each of said first plurality of transistors on and off.

6. An analog-to-digital converter according to claim 3 wherein the successive approximation means comprises:

second switching means for sequentially coupling the second reference voltage to the second terminals of each of the capacitors.

7. An analog-to-digital converter according to claim 6 wherein said voltage reference means includes a voltage divider comprised of first and second resistors of substantially equal resistance coupled in series between the first reference voltage and a third predetermined reference voltage which is substantially twice the second reference voltage relative to the first reference voltage.

* * * * *